United States Patent [19]
Tseng et al.

[11] Patent Number: 5,811,358
[45] Date of Patent: Sep. 22, 1998

[54] LOW TEMPERATURE DRY PROCESS FOR STRIPPING PHOTORESIST AFTER HIGH DOSE ION IMPLANTATION

[75] Inventors: Mao-Sung Tseng, Hsinchu; Chao Feng-Hsien, Chang-Hua; Nen-Yu Tsai, Taipei, all of Taiwan

[73] Assignee: Mosel Vitelic Inc., Taiwan

[21] Appl. No.: 774,728

[22] Filed: Jan. 3, 1997

[51] Int. Cl.$^6$ .................................. H01L 21/461
[52] U.S. Cl. .................... 438/725; 216/16; 430/329; 204/192.36
[58] Field of Search .................... 438/725, 301, 438/307; 216/16; 430/329; 134/1.1; 204/192.36

[56] References Cited

U.S. PATENT DOCUMENTS

| | | | |
|---|---|---|---|
| 4,350,563 | 9/1982 | Takada et al. | 156/643 |
| 4,961,820 | 10/1990 | Shinagawa | 156/643 |
| 5,160,404 | 11/1992 | Motoyama | 156/643 |
| 5,628,871 | 5/1997 | Shinagawa et al. | 438/514 |

*Primary Examiner*—R. Bruce Breneman
*Assistant Examiner*—Luz Alejandro
*Attorney, Agent, or Firm*—Bacon & Thomas

[57] ABSTRACT

A dry process for stripping photoresist from a semiconductor device during the manufacturing process and after high dose ion implantation is describe. The implant-hardened surface of the photoresist is first stripped by oxygen and nitrogen/hydrogen plasma at a lower temperature (<220° C.) to prevent popping problem. The bulk body of the photoresist is then stripped by oxygen and nitrogen/hydrogen plasma at a higher temperature (>220° C.) to provide a faster reaction rate. The semiconductor wafer is cleaned by ammonium hydroxide and hydrogen peroxide to completely remove remaining contaminant and photoresist residuals. The three-step dry process can effectively strip the post implant photoresist so that it ensures the cleanliness of the wafer for the succeeding processes.

10 Claims, 2 Drawing Sheets

LOW TEMPERATURE DRY PROCESS FOR STRIPPING PHOTORESIST AFTER HIGH DOSE ION IMPLANTATION

BACKGROUND

(1) Field of the invention

The present invention relates to a method of fabricating integrated circuit (IC) devices, and more particularly to the dry process for stripping photoresist after high-dose ion implantation during the fabrication process.

(2) Description of the Prior Art

In the fabrication of IC devices, the circuit layout patterns are transferred from photomasks to the surface of silicon wafer by photolithographic processes. The patterns are first transferred from the mask to a light-sensitive material called a photoresist. Chemical or plasma-etching is then employed to transfer the patterns from the photoresist to the barrier layer on the surface of silicon wafer. These patterns define different active regions of the circuit, for example, well contact window or interconnection regions, which allow the necessary ion implantation, etching or diffusion processes to be performed. Following these steps, the photoresist layer must be completely removed in order to ensure the cleanliness of the silicon wafer surface which is essential to the yield and performance of the IC fabricated devices.

Photoresist materials are sensitive to light radiation which alters their chemical or physical properties sufficiently so that a pattern can be delineated in them responsive to the exposure to actinic radiation. Photoresists are classified as positive or negative types. Positive photoresist materials are designed so that the effect of the radiation is to make them increasingly capable of dissolution by chemical solvents. Positive photoresists are made up of a light-sensitive polymeric material with weak links, a low molecular weight resin and a solvent.

On the other hand, negative photoresist materials are those which become more durable upon exposure to radiation. Most negative photoresists consist of polymeric organic materials.

After the etching process is completed, the photoresist needs to be stripped from the surface of the silicon wafer. There are three types of photoresist stripping methods: (1) organic strippers, (2) oxidizing-type inorganic strippers (See U.S. Pat. No. 4,994,346 to Meier et al., the entire disclosure of which is herein incorporated by reference) and (3) dry etching. The details of these types of photoresist stripping methods are described as follows.

(1) Organic strippers: positive photoresists are usually removed by these types of strippers which are chemical solvents such as acetone or methylethylketone.

(2) Oxidizing-type inorganic strippers: negative photoresists are considerably harder to remove than positive photoresists. One method to remove negative photoresists is to boil the silicon wafers containing the photoresists in concentrated sulfuric acid ($H_2SO_4$) for about 20 minutes, followed by mechanical agitation. Often a 1:1 mixture of hot sulfuric acid and hydrogen peroxide ($H_2O_2$) is used. The oxidizing-type inorganic strippers are also used to remove post ion-implantation or post baked photoresist. Since the hydrogen peroxide is reacted with the photoresist and water is produced from the reaction, the concentration of the hydrogen peroxide ($H_2O_2$) solution decreases with time and this decreases photoresist stripping efficiency which is a problem in the manufacturing process.

(3) Dry etching (See U.S. Pat. No. 5,310,703 to Visser et al., the entire disclosure of which is herein incorporated by reference). This is the most recent technique for photoresist removal and uses plasma oxidation (commonly called plasma ashing). The dry etching method has many advantages over wet etching. One is that it is a safer method to operate, another is less solvent contamination, and the most important aspect is that it is easy to monitor the etching end-point.

The conventional dry-etching photoresist removal process takes place in an oxygen plasma environment where oxygen radicals are formed. The oxygen radicals react with the photoresist and produce water and various other compounds thereby stripping the photoresist layer. In order to more effectively remove the photoresist after ion implantation, a high temperature (>200° C.) dry ashing method is carried out to strip the photoresist. (See U.S. Pat. No. 5,262,279 to Tsang et al., the entire disclosure of which is herein incorporated by reference). After the photoresist is developed, there is always the concern that the properties of the photoresist might be changed. Though the photoresist must be baked to a dry state after it is developed, some of the subsurface resists are popping out during the post-implantation stripping. Subsurface resist generally contains more volatile, shorter molecular weight polymer and occasional traces of dissolved solvent. These are light materials which tend to be volatile and build up pressure beneath the implant-hardened surface layer during the stripping of heated wafer. As the surface layer is thinned by etching, a point is reached at which this pressure can violently rupture the skin, an event that spreads particles of the implant-hardened cross-link hydrogen deficient surface layer material throughout the stripping chamber. The resulting diamond-like carbon particles make the photoresist stripping more difficult. In addition, the oxygen plasma can not effectively remove the impurities (for example Arsenic, Phosphorus or Boron) left in the photoresist while performing ion-implanting. These impurities react with the oxygen plasma to produce a species of oxides which are very hard to remove (particularly $As_2O_3$), even using sulfuric acid and hydrogen peroxide cleaning. Therefore, some photoresist still remain on the wafer surface which will effect the following processes.

The present invention discloses a method which can effectively strip the photoresist after high dose ion-implantation. The new process can also obtain clean wafer surfaces which is essential to improve the yields of the integrated circuit fabrication process.

SUMMARY OF THE INVENTION

The primary object of the present invention is a process for stripping photoresist after high dose ion-implantation.

Another object of the present invention relates to a low temperature oxygen plasma-etching process which can prevent the photoresist popping problem.

A further object of the present invention relates to a low temperature oxygen plasma etching process which can effectively strip the photoresist from the wafer.

In the present invention, these objects are accomplished by the following process. First, the silicon wafer is coated with a layer of photoresist and exposed to actinic radiation through a photomask and developed. After high-dose implantation, the silicon wafer containing the developed photoresist having been exposed to ion implantation is placed in a photoresist stripper for stripping the photoresist. The implant-hardened photoresist surface is removed by oxygen and nitrogen/hydrogen plasma in a low-temperature (<220° C.) environment. Then the temperature is increased to a higher temperature (>220°) to accelerate the stripping of the bulk part of photoresist, still using oxygen and nitrogen/hydrogen plasma.

The addition of nitrogen or hydrogen plasma can increase the ashing efficiency. There might be some oxide (especially $As_2O_3$) still remaining attached to the wafer, so nitrogen or hydrogen (without oxygen) plasma etching is performed to remove the residual oxide. In this plasma ashing process, contaminant and photoresist residuals are not etched during the photoresist stripping, but remains on the wafer surface. Finally, the wafer is cleaned by sulfuric acid and hydrogen peroxide followed by ammonium hydroxide and hydrogen peroxide to completely remove any particles left on the wafer. Thereafter, the wafer is ready for the succeeding processes.

BRIEF DESCRIPTION OF THE DRAWINGS

In the accompanying drawings forming a material part of this description, there is shown.

DESCRIPTION OF PREFERRED EMBODIMENT

The invention disclosed herein is directed to a method of stripping following high-dose ion-implantation of the photoresist in the fabrication of integrated circuit devices. In the following description, numerous details are set forth in order to provide a thorough understanding of the present invention. It will be appreciated by one skilled in the art that variations of these specific details are possible while still achieving the results of the present invention. In other instances, well-known processing steps are not described in detail in order to not unnecessarily obscure the present invention.

The following description illustrates an n-channel Metal-Oxide-Semiconductor Field Effect Transistor (MOSFET) fabrication process as a preferred embodiment to show the plasma-etch photoresist stripping process according to the present invention.

Figure 1:
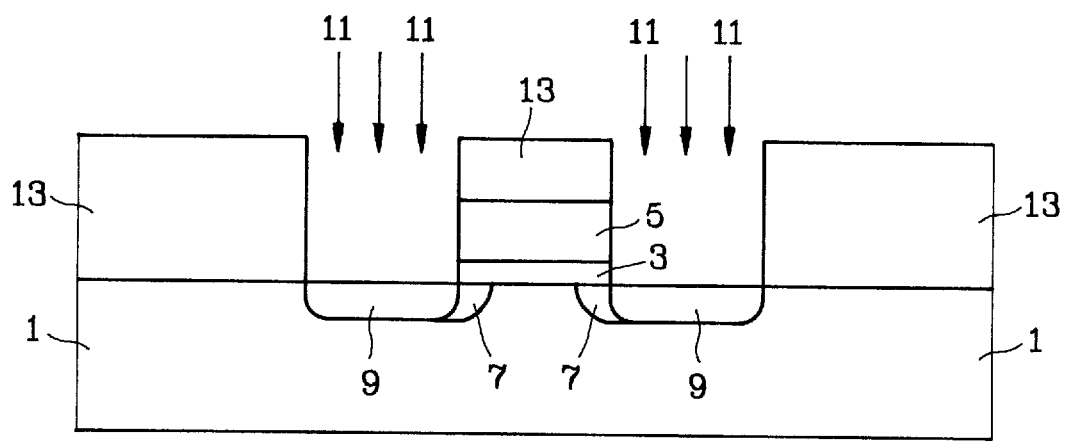
FIG. 1 illustrates a cross sectional representation of the MOSFET on which the present invention can be practiced.

Referring now more particularly to FIG. 1, the MOSFET on which the present invention can be practiced is first formed on a semiconductor substrate 1 by the standard VLSI technologies. The MOSFET usually comprises a gate oxide layer 3, a polysilicon gate 5, lightly doped regions 7, and source and drain (S/D) regions 9. Then the photoresist layer 13 is patterned as an ion-implantation mask by conventional lithography technique. The S/D regions 9 of the MOSFET which are formed by ion-implantation technique, are preferably doped with impurities 11 such as Arsenic ($As^{75}$), Phosphorus ($P^{31}$) or Boron ($B^{11}$) ions, with a high implantation dose in the range of $10^{15}$ to $5 \times 10^{16}$ cm$^{-2}$, and an implantation energy of 30 to 100 keV, which are depending on the junction depths.

Figure 2:
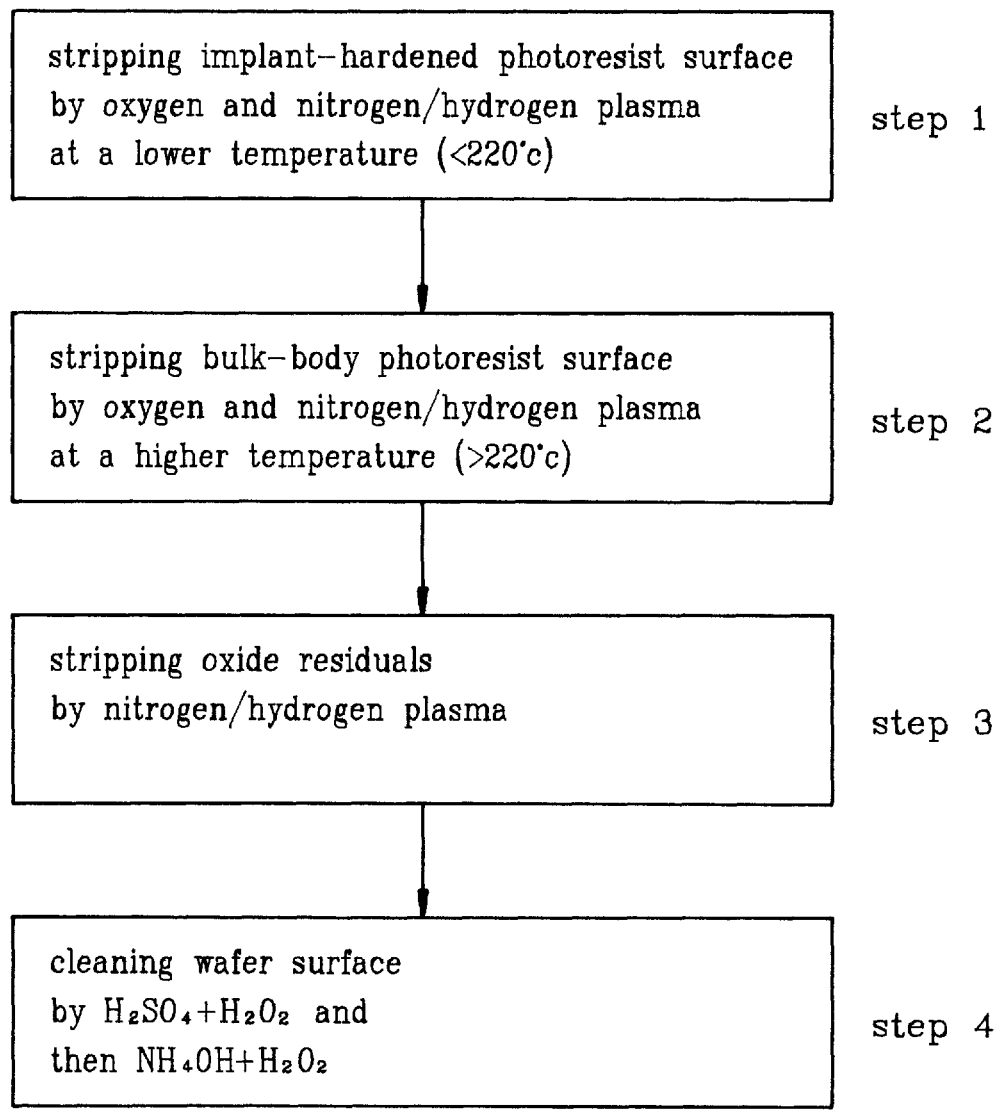
FIG. 2 shows a flow diagram of the stripping process following high dose implantation of the photoresists according to the present invention.

FIG. 2 illustrates a typical photoresist stripping process flow diagram after high dose-implantation according to the present invention. Referring to FIG. 2, the first step is that the implant-hardened photoresist surface is stripped by oxygen and a small amount of nitrogen/hydrogen plasma at a temperature below 220° C. and preferably in the temperature range of 150° C. to 220° C. The ratio of nitrogen to hydrogen may be, for example, about 96% to about 4%. The lower temperature is used to avoid stripping the photoresist at a higher temperature which introduces the popping problem which causes the photoresist to become even harder. It is necessary to remove the implant-hardened surface at a lower temperature to avoid this problem. The plasma-etch (ashing) process of this step is operated under the following conditions: The plasma power is about 800 to 1100 Watts, the pressure about 1000 to 1500 mTorr, with an oxygen flow rate of 1500 to 2000 sccm and a nitrogen/hydrogen flow rate of 100 to 200 sccm, for a time period of, for example, 10–20 seconds, preferably 15 seconds.

The second step is to remove the bulk of the photoresist body at a higher temperature for better efficiency. The subsurface of the photoresist is stripped by the same oxygen and small amount of nitrogen/hydrogen plasma at a temperature above 220° C. The addition of hydrogen plasma can effectively break the chemical bonds of the photoresist to increase the reaction rate. The plasma-etch (ashing) process of this step is operated under the same plasma power, pressure and gas flow rates as described above except that the time is change to about 30–60 seconds to remove thicker photoresist layer.

After the previous two steps, there may still be some oxides (especially $As_2O_3$) which are formed by the dopants reacting with the oxygen plasma still remaining attached to the wafer. A third step plasma-etch (ashing) is performed in an oxygen-free (only nitrogen/hydrogen) plasma environment to completely remove the residual oxides. The plasma power of this step is about 800 to 1100 Watts, with nitrogen/hydrogen mixture gas flow rate of 1500 to 2000 sccm.

Finally, the wafer needs to be cleaned by solvents to remove residual contaminant and photoresist left on the wafer surface. The typical wafer cleaning process in the VLSI industry is to wet-etch dip the wafer in sulfuric acid and hydrogen peroxide solutions, followed by washing in ammonium hydroxide ($NH_4OH$) and hydrogen peroxide. This process can result in minimal particulates so as to ensure high yield for the fabrication of integrated circuits. The post high dose implantation photoresist stripping process according to the present invention is then accomplished.

While the invention has been particularly shown and described with reference to a preferred embodiment, it will be understood by those skilled in the art that various changes in form and detail may be made therein without departing from the spirit and scope of the present invention.

What we claim is:

1. A method of post high dose ion-implantation photoresist stripping in a manufacture of a semiconductor device, said method comprising the steps of:

providing semiconductor device structures on a semiconductor substrate;

forming a photoresist layer as ion-implantation mask on the semiconductor substrate;

performing high dose ion implantation into said semiconductor substrate while hardening a surface of said photoresist mask to form a mask with a hardened surface and a subsurface;

first plasma-etching the implant-hardened surface of said photoresist layer, wherein said first plasma-etching includes oxygen and nitrogen/hydrogen plasmas;

second plasma-etching the subsurface of said photoresist layer, wherein said second plasma-etching includes oxygen and nitrogen/hydrogen plasmas and takes place at a higher temperature than said first plasma-etching;

third plasma-etching any residual oxide on said photoresist layer, wherein said third plasma-etching includes nitrogen/hydrogen plasmas; and cleaning said semiconductor substrate.

2. The method of claim 1, wherein said semiconductor device structure comprises a source/drain regions of an integrated circuit.

3. The method of claim 1, wherein said high dose ion implantation has a dose of $10^{15}$ to $5 \times 10^{16} cm^{-2}$.

4. The method of claim 1, wherein said cleaning uses sulfuric acid and hydrogen peroxide followed by ammonium hydroxide and hydrogen peroxide solvents.

5. The method of claim 1, wherein said higher temperature is above 220° C.

6. The method of claim 1, wherein the first plasma-etching takes place at a temperature in the range of from 150° to 200° C.

7. The method of claim 1, wherein the implant-hardened photoresist surface is removed by oxygen and nitrogen/hydrogen plasma in a low temperature environment and then the temperature is increased to a higher temperature than said first plasma-etching to accelerate stripping of the sub-surface of said photoresist while using oxygen and nitrogen/hydrogen plasma and removing any oxide residual still remaining attached to the wafer with a third plasma-etching using nitrogen or hydrogen.

8. The method of claim 7, wherein the residual oxide is $As_2O_3$.

9. The method of claim 8, wherein the third step plasma-etch is performed in an oxygen-free plasma environment.

10. The method of claim 7, wherein the third step plasma-etch is performed in an oxygen-free plasma environment.

* * * * *